(12) United States Patent
Pontius

(10) Patent No.: US 9,996,648 B2
(45) Date of Patent: Jun. 12, 2018

(54) NETLIST EDITING OF GRAPHICAL DATA

(71) Applicant: GLOBALFOUNDRIES INC., Grand Cayman (KY)

(72) Inventor: Dale E. Pontius, Colchester, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 116 days.

(21) Appl. No.: 15/142,511

(22) Filed: Apr. 29, 2016

(65) Prior Publication Data

US 2017/0316136 A1  Nov. 2, 2017

(51) Int. Cl.
*G06F 17/50* (2006.01)
(52) U.S. Cl.
CPC .................. *G06F 17/5045* (2013.01)
(58) Field of Classification Search
USPC .......................................................... 716/139
See application file for complete search history.

(56) References Cited

U.S. PATENT DOCUMENTS

| 8,121,826 B1 * | 2/2012 | Neely | G06F 17/5054 703/14 |
| 8,650,517 B1 * | 2/2014 | Sundararajan | G06F 17/5045 716/101 |

\* cited by examiner

*Primary Examiner* — Bryce Aisaka
(74) *Attorney, Agent, or Firm* — David Cain; Andrew M. Calderon; Roberts Mlotkowski Safran Cole & Calderon, P.C.

(57) ABSTRACT

The present disclosure relates to customization of a circuit layout using information from a netlist, and more particularly, to customization of a circuit layout using embedded formulas and a netlist. The system includes a CPU, a computer readable memory, and a computer readable storage device. The system also includes first program instructions to generate a graphical layout of a circuit, second program instructions to place a text formula on the graphical layout of the circuit, and third program instructions to activate the text formula in order to customize the graphical layout of the circuit. The first program instructions, the second program instructions, and the third program instructions of the system are stored on the computer readable storage device for execution by the CPU via the computer readable memory.

20 Claims, 6 Drawing Sheets

NETLIST EDITING OF GRAPHICAL DATA

FIELD OF THE INVENTION

The present disclosure relates to customization of a circuit layout using information from a netlist, and more particularly, to customization of a circuit layout using embedded formulas and a netlist.

BACKGROUND

Compilers use overlays, which are typically added at an origin of a cell that is being customized in order to personalize a circuit layout. When a given circuit has several orthogonal customization possibilities, there will need to be one or more overlays for each of those options. When using several overlays for each of the orthogonal customization possibilities, the complexity is increased. For example, when decoding each address input, typically two to four overlays may be required.

In a high level circuit design, netlists can be in the form of a hardware description language such as verilog or a circuit level description such as a simulation program with integrated circuit emphasis ("spice") or circuit design language ("cdl"). However, existing compilers require specific knowledge from the compiler code, such as a lower-level level layout in order to generate graphical data of a given circuit.

SUMMARY

In a first aspect of the disclosure, there is a system which includes a CPU, a computer readable memory, and a computer readable storage device. The system also includes first program instructions to generate a graphical layout of a circuit, second program instructions to place a text formula on the graphical layout of the circuit, and third program instructions to activate the text formula in order to customize the graphical layout of the circuit. The first program instructions, the second program instructions, and the third program instructions of the system are stored on the computer readable storage device for execution by the CPU via the computer readable memory.

In another aspect of the disclosure, there is a computer program product including a computer readable storage device having program instructions embodied therewith, the computer readable storage device is not a transitory signal, and the program instructions are readable by a computing device to cause the computing device to perform a method. The method includes generating a graphical layout of a circuit, placing a text formula on the graphical layout of the circuit, and activating the text formula in order to draw a polyline at an origin of the text formula.

In another aspect of the disclosure, there is a method implemented in a computer infrastructure having computer executable code tangibly embodied on a computer readable storage device having programming instructions configured to generate a graphical layout of a circuit, place a text formula on the graphical layout of the circuit, and activate the text formula in order to draw a shape at an origin of the text formula.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
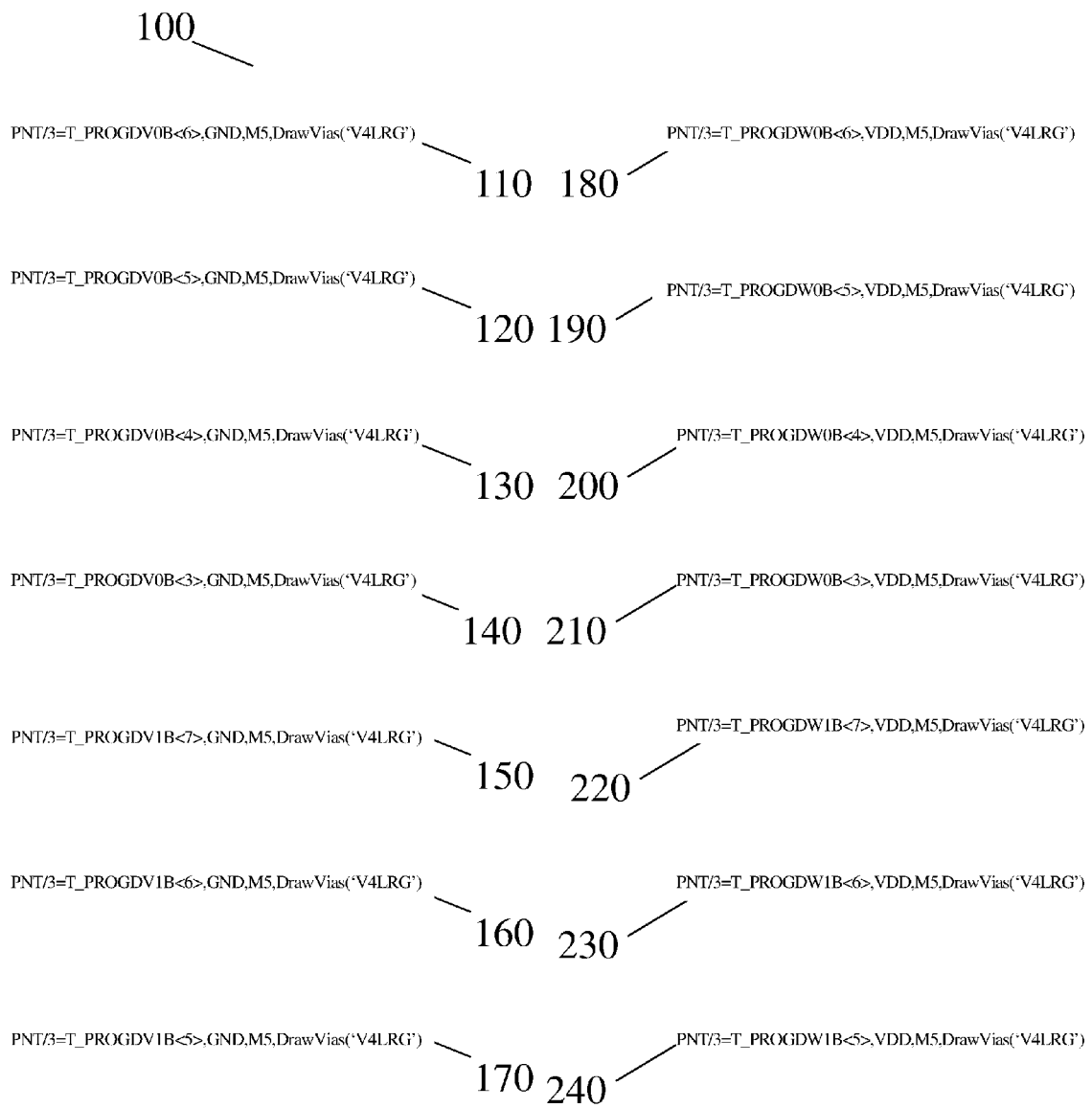
FIG. 1 shows a schematic view of text formulas in a kernel-level layout in accordance with aspects of the disclosure.

The present disclosure relates to customization of a circuit layout using information from a netlist, and more particularly, to customization of a circuit layout using embedded formulas and a netlist. In particular, the disclosure interprets text formula embedded in a graphical layout using information present in a netlist in order to customize a graphical layout of a circuit. Advantageously, in this way, it is now possible to provide customizable graphical layouts without the need to evaluate and customize at one of the compiled hierarchical levels, i.e., removes the need for compiler code to require specific knowledge from a lower-level layout.

More specifically, the present disclosure uses text formulas which are placed on a graphical layout, and with a design netlist, read into a software program which interprets the text formula into a context of higher levels of hierarchy. For example, if the text formula evaluates to Boolean "True", an indicated shape or cell transform is added to a higher hierarchical level of the graphical layout, using an original location and an orientation of the text formulas along with hierarchical transformations which have been performed. Further, the present disclosure, which is different from other compilers, uses a complete netlist and mostly complete layout with a software program to complete customization of a graphical layout. Thus, the present disclosure does not need to evaluate and customize at one of the compiled hierarchical levels. In other words, the present disclosure removes the need for compiler code to require specific knowledge from a lower-level layout.

Compilers (e.g., SRAM compilers, DRAM compilers, silicon compilers, etc.) use overlays, typically added at an origin of a cell that is being customized. When a given circuit has several orthogonal customization possibilities, there will need to be one or more overlays for each of those options. In contrast, in the embodiments of the present disclosure, a standard via cell can be used. In addition, if a text formula is somewhere on one of the metals and one of the metals or other components and/or layers is moved, the text formula will move with that specific metal or other components and/or layers. This is easier than using discrete overlays (non-standard overlays), in which overlays associated with that specific metal must all be updated individually.

Accordingly, by implementing aspects of the present disclosure, a compiler does not need to have specific information about the layout of the circuit. Instead, the compiler only needs code which correlates the text formulas in the layout to the connections in the netlist in order to perform customization of the layout. Further, in implementation, the compiler uses the netlist to drive customization of a generic layout. In contrast, known compilers need to contain detailed knowledge of both the netlist and the layout.

Although the systems and methods described hereafter are with regard to exemplary methods, and/or computer program products, it should be understood that other implementations are also contemplated by the present disclosure as described herein. For example, other devices, systems, appliances, and/or computer program products according to embodiments of the present disclosure will be or become apparent to one of ordinary skill in the art upon review of the drawings and detailed description. It is intended that all such additional other devices, systems, appliances, processes, and/or computer program products be included within the scope of the present disclosure.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Figure 6:
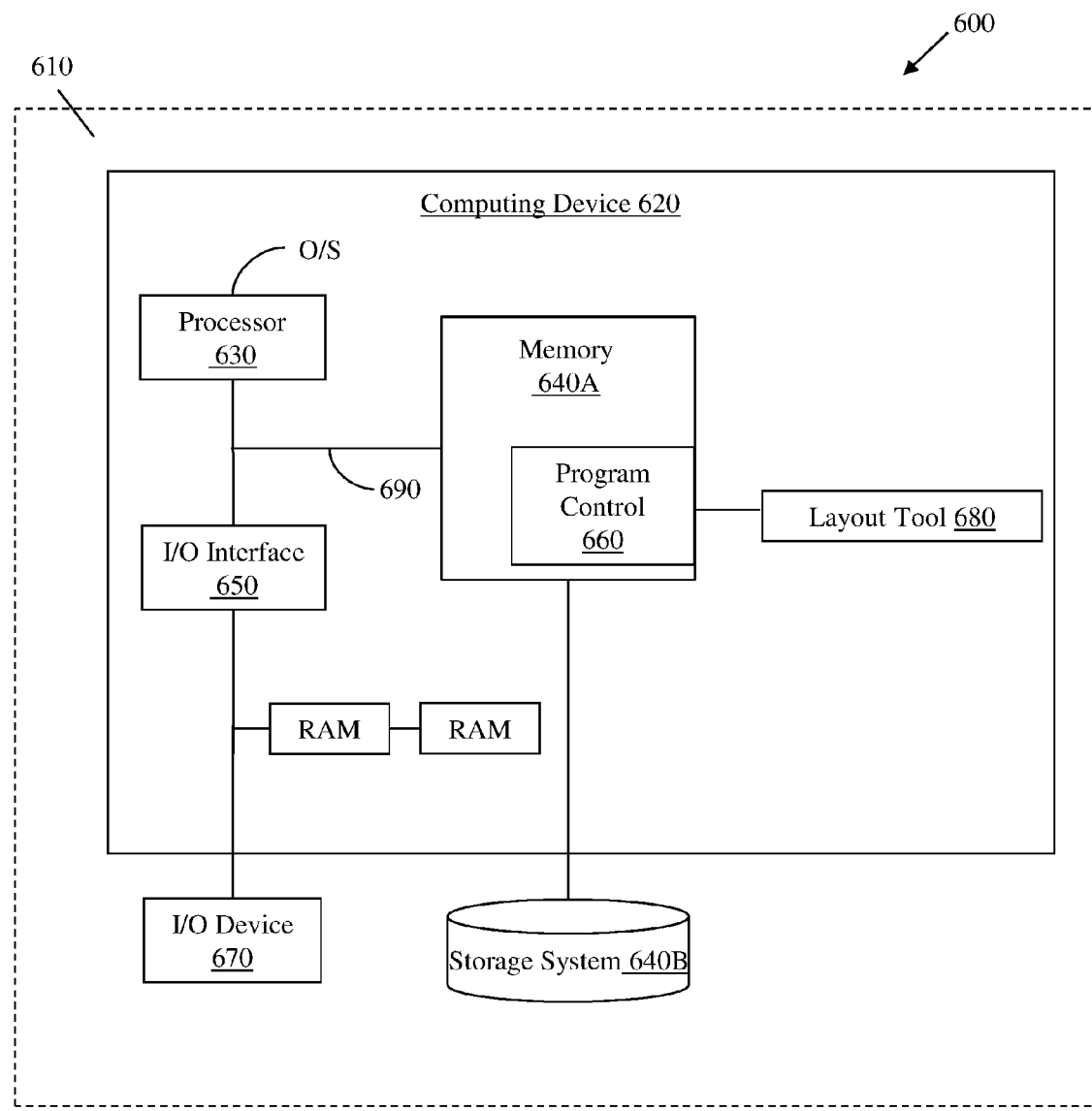
FIG. 6 shows a computer environment for implementing the steps in accordance with aspects of the disclosure.

The computer program product may include a computer readable storage medium (or media) having computer readable program instructions thereon for causing a processor to carry out aspects of the present disclosure. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, and any suitable combination of the foregoing. A computer readable storage medium is not to be construed as being transitory signals per se; instead, the computer readable storage medium is a physical medium or device, which stores the data. The computer readable program instructions may also be loaded onto a computer, for execution of the instructions as shown in FIG. 6.

FIG. 1 shows a schematic view of text formulas in a kernel-level layout in accordance with aspects of the disclosure. By way of example, the kernel-level layout 100 in FIG. 1 may include text formulas 110, 120, 130, 140, 150, 160, 170, 180, 190, 200, 210, 220, 230, and 240. One of ordinary skill in the art would understand that each of the text formulas 110, 120, 130, 140, 150, 160, 170, 180, 190, 200, 210, 220, 230, and 240 in FIG. 1 may have different content based on the circuit application. However, the general parameters of text formula in FIG. 1 is shown below:

<formula type>/<hierarchy specifier>=<formula parameter 1>, . . . , <formula parameter n>, where n is the total number of formula parameters.

As an example, text formula 110 in FIG. 1 has the <formula type> as "PNT", which represents Pin-Net-Transform. "PNT" in the text formula 100 indicates the logical expression of "when this pin is connected to a certain net, instantiate that transform". Further, in the text formula 110 in FIG. 1, <hierarchy specifier> is an integer. The integer indicates the logical expression of skipping <hierarchy specifier> levels up the hierarchy, and then evaluating the <formula type> at that hierarchical level. For example, "PNT/3" would be evaluated at three levels above where the kernel was placed (i.e., at a highest level). Therefore, "PNT/2" would be evaluated at another level lower than "PNT/3", and "PNT/1" would be evaluated at another level lower than "PNT/2". Further, "PNT/0" is one level lower than "PNT/1" and is also the evaluation point. Therefore, "PNT/0" is not placed in the layout by a designer.

Further, one of ordinary skill in the art would understand that a designer only places the first string "PNT/3" into a kernel layout for use by the compiler. The rest of the strings (i.e., "PNT/2", "PNT/1", and "PNT/0") are strings which are internal to the compiler. In other words, the designer places "PNT/3" into a kernel layout for the compiler, and the compiler generates "PNT/2", "PNT/1", and "PNT/0" into a complied layout, so that the designer can observe how those strings have been interpreted in the kernel and the netlist's effects on these text formulas. Thus, "PNT/3" is the only text formula which is placed in a layout by the designer, and "PNT/2", "PNT/1", and "PNT/0" are generated by the compiler for diagnosis and evaluation of the kernel and the netlist.

Further, in the text formula 110 in FIG. 1, the parameters of T_PROGDV0B<6>, GND, M5, DrawVias ('V4LRG') indicate the logical expression of "if this pin is connected to ground, draw via shape V4LRG with connections to ground". Thus, the text formula 110 has to be evaluated as "True" for via shape V4LRG to be drawn (i.e., the text formula 110 is activated). If the text formula 110 is evaluated as "False", no shape is drawn and there is no instantiation of the transform (i.e., the text formula is not activated). Evaluation of the text formula 110 (and all text formulas in FIG. 1) will occur at "PNT/0" (i.e., at a lowest level where the kernel is placed, which also is an evaluation level).

As another example, text formula 180 in FIG. 1 is similar to the text formula 110; however, in the text formula 180 in FIG. 1, T_PROGDW0B<6> will change based on a netlist hierarchy and indicate the logical expression of "if this pin is connected to VDD, draw via shape V4LRG with connections to VDD". Thus, the text formula 180 has to be evaluated as "True" for via shape V4LRG to be drawn (i.e., the text formula 180 is activated). If the text formula 180 is evaluated as "False", no shape is drawn and there is now instantiation of the transform (i.e., the text formula 180 is not activated). The text formula 180 is evaluated and activated at "PNT/0" (i.e., evaluation level).

Moreover, in the present disclosure, one of ordinary skill in the art would understand that in FIG. 1, the pin would be connected to one of VDD or GND, so one of text formulas 110 and 180 should be evaluated as "True". The same situation holds true for text formulas 120 and 190, 130 and 200, 140 and 210, 150 and 220, 160 and 230, and 170 and 240. Although one of ordinary skill in the art would understand that alternate connections can be made in other graphical layouts, FIG. 1 shows text formulas 110, 120, 130, 140, 150, 160, 170, 180, 190, 200, 210, 220, 230, and 240 in which a pin is connected to either VDD or GND.

Other text formulas are also contemplated for use herein, and the examples provided herein should not be considered limiting features. It should thus be recognized that the text formula, regardless of its specific content, can be implemented and overlaid onto a generic layout and, upon activation and implementation, such layout can be customized at any level in accordance with the details provided herein. In embodiments, the text formulas can include, as non-limiting, illustrative examples:

PNT—If the pin is connected to the correct net, add a personalization shape/transform. Add a net label each time when going up the hierarchy;

PNTI—Same as PNT, but does not add the net label;

PNTT—Same as PNT, except only add the net label at the very top of the hierarchy;

PIO—Labels will be added when going up the hierarchy (i.e., used for macro I/O pins which have specific labeling requirements);

PIOT—Same as PIO, except at the top level, add a personalization shape/transform if that pin is being used for I/O and not stubbed;

PIOT, PIOTT—relates to PIO in the same way as PNTI and PNTT relate to PNT (i.e., for labeling purposes);

PWR, PWRT, PWRTT—relates in the same way as PNTI and PNTT related to PNT, except these text formulas are for power pins; and ILT—instance lookup table.

Figure 2:
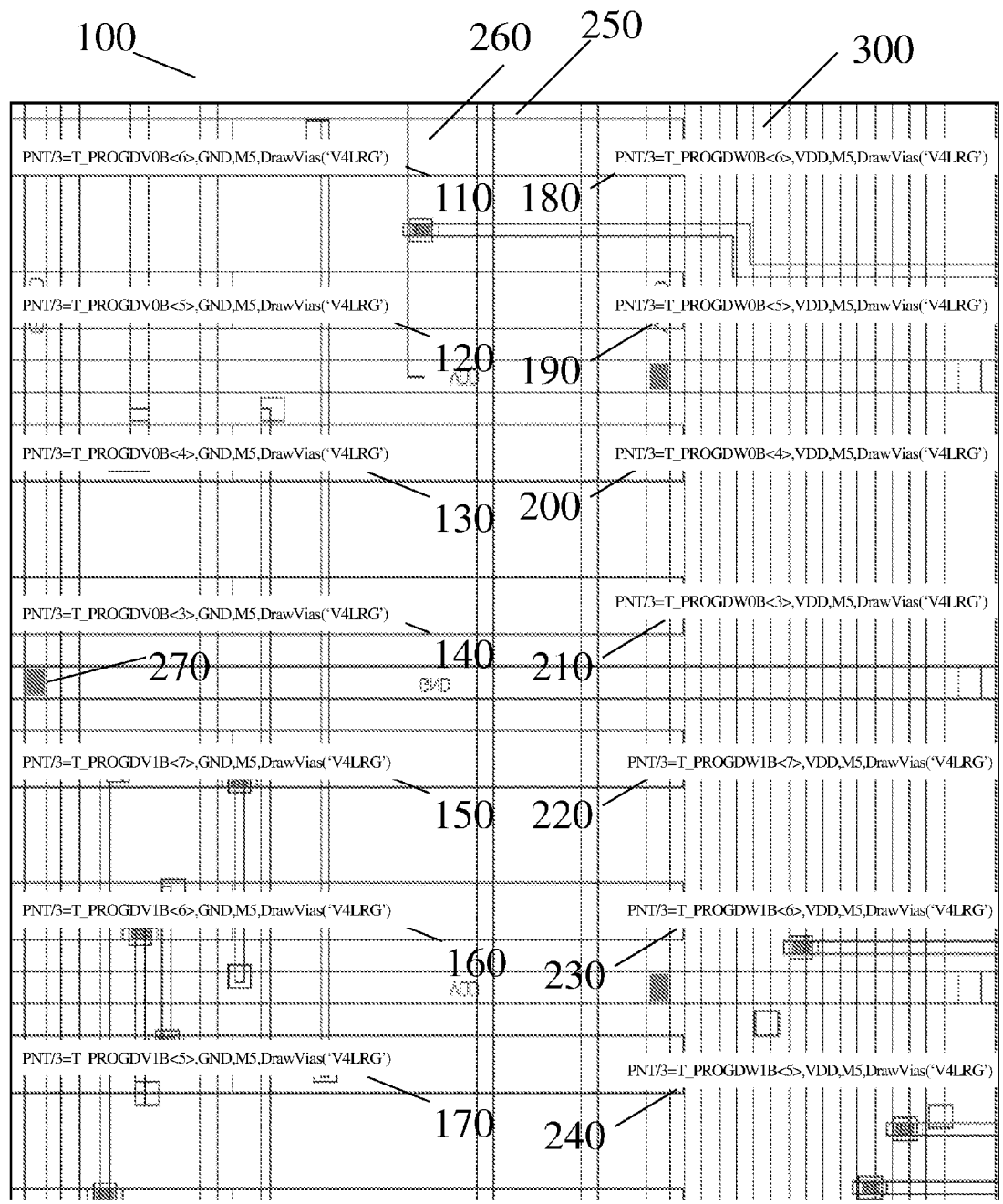
FIG. 2 shows a schematic view of the text formulas of FIG. 1 overlaid on a generic graphical layout of a circuit in accordance with aspects of the disclosure.

FIG. 2 shows a schematic view of the text formulas of FIG. 1 overlaid on a generic graphical layout of a circuit in accordance with aspects of the disclosure. Although FIG. 1 shows a schematic view of text formulas in a kernel-level layout, typically the text formulas are overlaid on a generic graphical layout of a circuit as shown in FIG. 2. Thus, FIG. 2 shows the text formulas 110, 120, 130, 140, 150, 160, 170, 180, 190, 200, 210, 220, 230, and 240 of FIG. 1 overlaid on a generic graphical layout 300. The generic graphical layout 300 and the text formulas 110, 120, 130, 140, 150, 160, 170, 180, 190, 200, 210, 220, 230, and 240 can be generated using a layout tool or graphical editor, and displayed in a graphical browser.

In embodiments, the layout tool and the graphical browser may be a software program which runs on a computing device. Further, the layout tool may be executed by a processor in a computing device as shown, for example, in FIG. 6.

In FIG. 2, the graphical layout 300 shows the metal and via layers of the circuit. In this example, horizontal lines 250 are a metal M5, where M5 represents a metal at a fifth sequential layer of the circuit. Further, vertical lines 260 are a metal M4, where M4 represents a metal at a fourth sequential layer of the circuit. Moreover, in FIG. 2, as an example, vias 270 are an existing connection between metal M4 and metal M5 in the generic graphical layout 300. Each of the vias 270 is included in the generic graphical layout 300.

In FIG. 2, M4, M5, and vias 270 are used as examples, but embodiments are not limited to only these examples. In other words, the generic graphical layout 300 of FIG. 2 can include multiple and varied metal layers and via connections. At this point, no customization of the graphical layout 300 has been performed. Also, no activation of the text formulas 110, 120, 130, 140, 150, 160, 170, 180, 190, 200, 210, 220, 230, and 240 has been performed.

Figure 3:
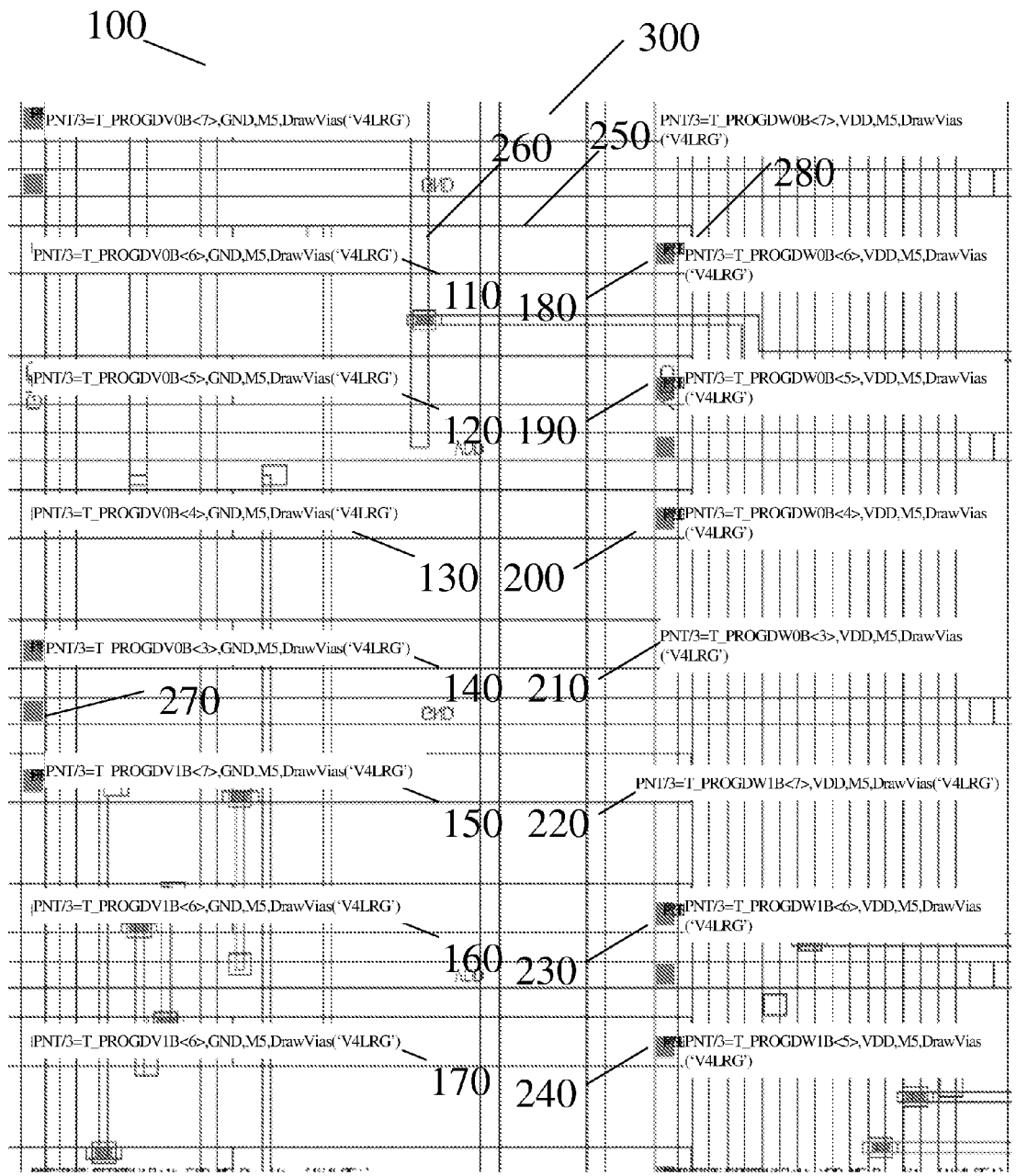
FIG. 3 shows a schematic view of a customization of the generic graphical layout of the circuit in FIG. 2 based on the text formulas in accordance with aspects of the disclosure.

FIG. 3 shows a schematic view of a customization of the generic graphical layout of the circuit in FIG. 2 based on the text formulas. In particular, FIG. 3 shows the text formulas 110, 120, 130, 140, 150, 160, 170, 180, 190, 200, 210, 220, 230, and 240 of FIG. 1 overlaid on a generic graphical layout 300 with the activation of the text formulas being performed. As shown in FIG. 3, the generic graphical layout 300 includes the horizontal lines 250, the vertical lines 260, and the vias 270, which represent existing elements of the generic graphical layout 300 before activation of the text formulas.

Activation of the text formulas can be performed using a software program and more specifically, a compiler. The compiler will step through each hierarchical level (i.e., "PNT/3", "PNT/2", "PNT/1", and finally "PNT/0"), and then activate the text formula at the evaluation level (e.g., "PNT/0"). The activation of the text formula occurs when there is a match (i.e., evaluates as "True") between, e.g., T_PROGDV0B<6> (this expression changes based on a netlist hierarchy) and "VDD". In other words, a via shape V4LRG 280 is drawn at "M5" in FIG. 3 when the pin (e.g., T_PROGDV0B<6>) is connected to VDD (and therefore matches the expression "VDD").

In particular, as shown in FIG. 3, via shape V4LRG 280 is drawn at the beginning of the text formula 180 when the text formula 180 is activated (i.e., the pin is connected to VDD, which creates an evaluation of "True"). As previously referenced in FIG. 1, this indicates that the pin is connected to VDD, so that the via shape V4LRG 280 is drawn at the beginning of the text formula 180. Based on the example in FIG. 3, the software program draws the via at an origin of the text formula 180 (i.e., at the beginning of the text description of the text formula 180). However, one of ordinary skill in the art would understand that the software program can be customized so that via shape V4LRG 280 can be drawn at different locations of the text formula 180 (i.e., at the end of the text formula 180, at a midpoint of the text formula 180, etc.) In FIG. 3, text formulas 140, 150, 190, 200, 230, and 240 are activated (i.e., evaluated as "True"), while text formulas 110, 120, 130, 160, 170, 210, and 220 are not activated (i.e., evaluated as "False"). In particular, text formula 140 and 150 are evaluated as "True" because a pin is connected to "GND", and text formulas 190, 200, 230, and 240 are evaluated as "True" because a pin is connected to "VDD".

Accordingly, FIG. 3 shows that the embodiments of the present disclosure do not need a compiler which has knowledge of a lower-level level layout in order to generate graphical data of a given circuit. In other words, aspects of the present disclosure remove the need for compiler code to require specific knowledge from the lower-level layout. In fact, a software program can generate the graphical data of the given circuit without knowledge of the lower-level layout, and can use the text formulas of FIGS. 1-3 and a netlist in order to generate the graphical data of the given circuit. Thus, the embodiments of the present disclosure act as a "design accelerator" by reducing manual effort and abstracting information from the lower-level layouts to reduce complexity and enhance efficiency.

Figure 4:
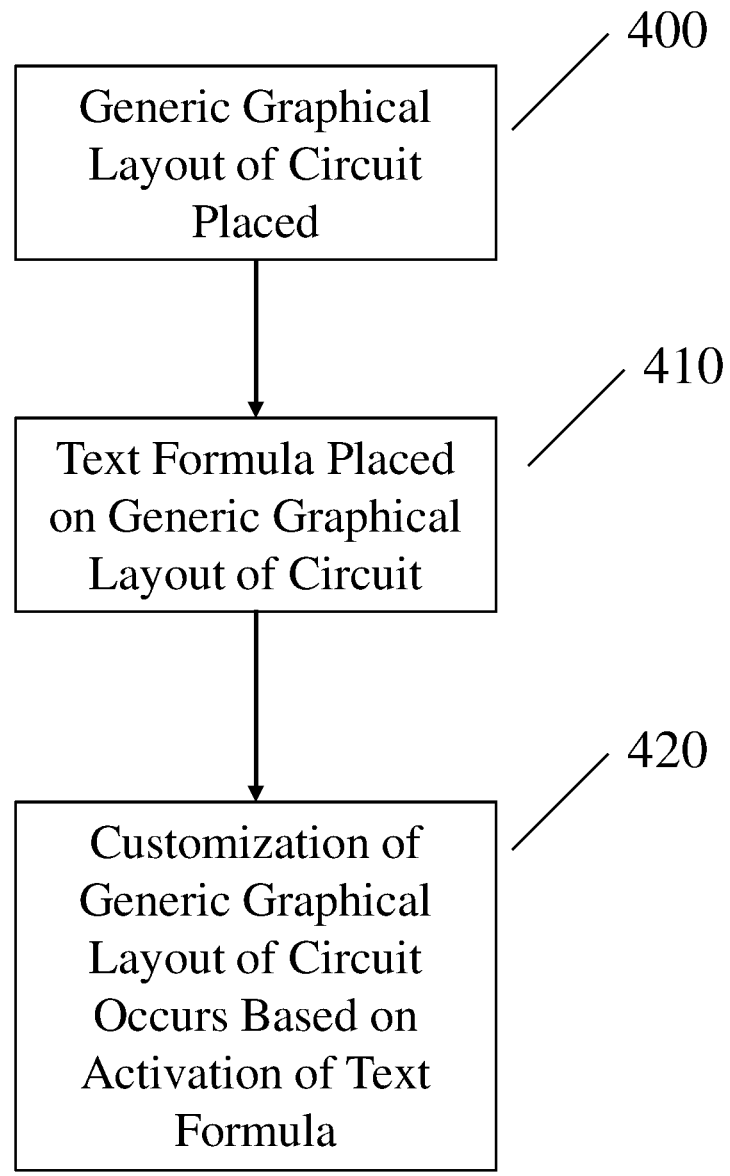
FIG. 4 shows a method of customizing a generic graphical layout of a circuit in accordance with aspects of the disclosure.

FIG. 4 shows a flowchart showing processes of customizing a generic graphical layout of a circuit in accordance with aspects of the disclosure. As should be understood, aspects of the present disclosure are described herein with reference to flowchart illustrations which can be representative of diagrams of methods, apparatus (systems), and computer program products implemented in the infrastructure shown in FIG. 6, for example. Accordingly, it will be understood that each block of the flowchart illustrations can be implemented by computer readable program instructions.

Referring to FIG. 4, at step 400, a generic graphical layout of a circuit is placed (i.e., generated) by a layout tool or graphical editor and displayed in a graphical browser. Further, any software program used by one of ordinary skill in the art to generate a graphic layout of a circuit can be used. At step 410, a text formula (e.g., at least one of text formulas 110, 120, 130, 140, 150, 160, 170, 180, 190, 200, 210, 220, 230, and 240 in FIGS. 1-3) is placed on the generic graphical layout of the circuit. The text formula can be representative of any desired layout or components thereof.

Finally, at step 420, based on activation of at least one text formula (e.g., at least one of text formulas 110, 120, 130, 140, 150, 160, 170, 180, 190, 200, 210, 220, 230, and 240 in FIGS. 1-3) in a software program and more specifically, a compiler, the generic graphical layout of the circuit is customized. At step 420, the generic graphical layout of the circuit is customized based on activation (e.g., evaluation) of at least one of the text formulas 110, 120, 130, 140, 150, 160, 170, 180, 190, 200, 210, 220, 230, and 240 (as shown in FIGS. 1-3). In particular, the software program (e.g., compiler) will step through each hierarchical level (i.e., "PNT/3", "PNT/2", "PNT/1", and finally "PNT/0"), and then activate the text formula at the evaluation level (e.g., "PNT/0"). The activation of the text formula occurs when there is a match (i.e., evaluates as "True") between, e.g., T_PROGDV0B<6> (this expression changes based on a netlist hierarchy) and "VDD". In other words, at step 420, a via shape V4LRG 280 is drawn at "M5" in FIG. 3 when the pin (e.g., T_PROGDV0B<6>) is connected to VDD (i.e., therefore, a matches occurs with the expression "VDD" and the text formula is activated).

At step 420, via shape V4LRG 280 is drawn at the beginning of the text formula 180 when the text formula 180 is activated (i.e., the pin is connected to VDD, which creates an evaluation of "True"). Further, the activation of the text formula 180 indicates that the pin is connected to VDD, so that the via shape V4LRG 280 is drawn at the beginning of the text formula 180. In this example, the software program draws the via at an origin of the text formula 180 (i.e., at the beginning of the text description of the text formula 180). However, one of ordinary skill in the art would understand that the implementations provided herein can be customized so that via shape V4LRG 280 can be drawn at different locations of the text formula 180 (i.e., at the end of the text formula 180, at a midpoint of the text formula 180, etc.)

Further, in FIG. 4, as a further example, text formulas 140, 150, 190, 200, 230, and 240 are activated (i.e., evaluated as "True"), while text formulas 110, 120, 130, 160, 170, 210, and 220 are not activated (i.e., evaluated as "False"). In particular, text formula 140 and 150 are evaluated as "True" because a pin connected to "GND", and text formulas 190, 200, 230, and 240 are evaluated as "True" because a pin is connected to "VDD". However, one of ordinary skill in the art would understand that the text formulas which are activated and not activated depend on the circuit level connections, and may be variously modified depending on an implemented circuit design. Thus, using the method of FIG. 4, the embodiments of the present disclosure remove the need for a compiler to have specific knowledge from a lower-level layout of the circuit. The compiler only needs code which correlates the text formulas in the graphical layout to the connections in the netlist hierarchy in order to perform customization of the graphical layout.

Figure 5:
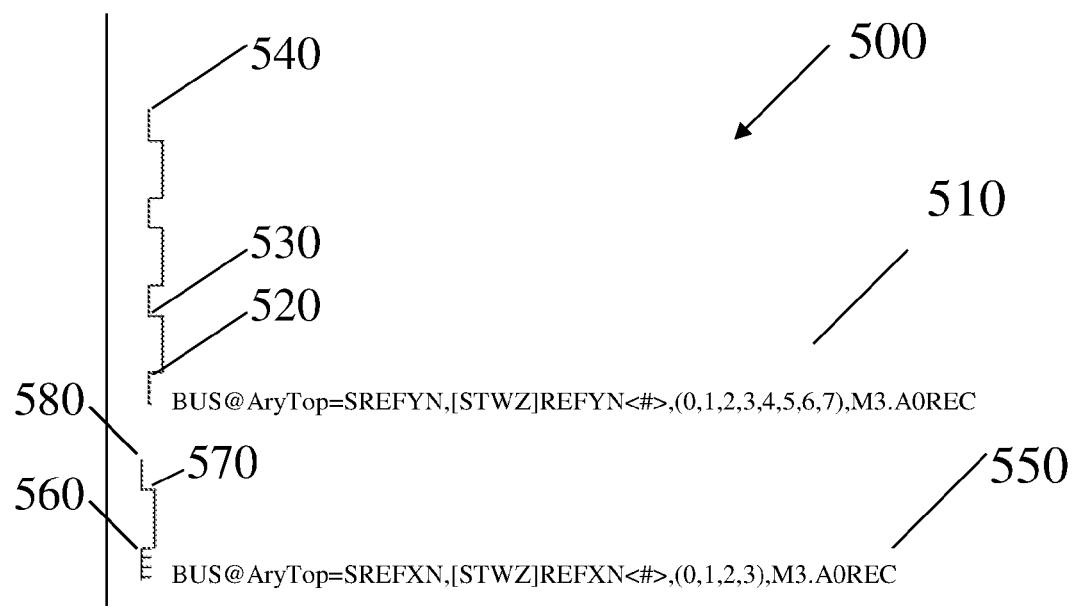
FIG. 5 shows a schematic view of another text formula with a polyline in accordance with aspects of the disclosure.

FIG. 5 shows a schematic view of another text formula with a polyline in accordance with aspects of the disclosure. In embodiments, the text formula of FIG. 5 can be activated by a software program or a compiler, similar to FIG. 3. In particular, the text formula with the polyline 500 includes text formulas 510 and 550.

In FIG. 5, text formula 510 has the following form: BUS@AryTop=SREFYN,[STWZ]REFYN<#>,(0,1,2,3,4,5,6,7),M3, A0REC. Further, text formula 510 indicates that a polyline is drawn from the text origin 520 (i.e., from the beginning of "BUS" of text formula 510). The next vertex (not labeled) defines the direction of the run. At that point, the polyline jogs perpendicular, then parallel, then perpendicular again, and comes back into line with the first two vertices at vertex 530. The vertices are all in a single line which defines potential coordinate points, and the jogs and the points associated with the jogs highlight the aligned points. One of ordinary skill in the art would understand that there may be many points, many jogs, etc. For example, in the text formula 510, there are eight identified points. Thus, the parameter <#>,(0,1,2,3,4,5,6,7) indicates that at the text (and line) origin 520, the vertex is "0". At the next vertex (not labeled), it is "1", then "2" at the next vertex 530, and so on up to "7" at the last vertex 540. In the text formula 510, the numbers assigned to the vertices are in numerical order, but one of ordinary skill in the art would understand that the text formula 510 does not require a numerical order.

In FIG. 5, the text formula 550 indicates that the polyline is drawn from the text origin 560 (i.e., from the beginning of "BUS" of text formula 550). The text formula 550 includes the parameter <#>,(0,1,2,3). In this way, the polyline associated with the text formula 550 is a subset of the polyline associated with the text formula 510. In other words, the text formula 550 only has vertices of 0 (e.g., text origin 560), 1 (not labeled), 2 (e.g., vertex 570), and 3 (e.g., vertex 580), instead of 0, 1, 2, 3, 4, 5, 6, and 7 (as shown in text formula 510).

FIG. 6 shows a computer infrastructure for implementing the steps in accordance with aspects of the disclosure. To this extent, the infrastructure 600 includes a server 610 or other computing system that can perform the processes described herein. In particular, server 610 includes a computing device 620. The computing device 620 can be resident on a network infrastructure or computing device of a third party service provider (any of which is generally represented in FIG. 6).

The computing device 620 also includes a processor 630 (e.g., CPU), memory 640A, an I/O interface 650, and a bus 690. The memory 640A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 620 is in communication with external I/O device/resource 650 and storage system 640B. For example, I/O device 670 can comprise any device that enables an individual to interact with computing device 620 (e.g., user interface) or any device that enables computing device 620 to communicate with one or more other computing devices using any type of communications link. The external I/O device/resource 650 may be for example, a handheld device, PDA, handset, keyboard etc.

In general, processor 630 executes computer program code (e.g., program control 660), which can be stored in memory 640A and/or storage system 640B. Moreover, in accordance with aspects of the invention, program control 660 controls a layout tool 680, which performs the processes described herein. The layout tool 680 can be implemented as one or more program code in program control 660 stored in memory 640A as separate or combined modules. Additionally, the layout tool 680 may be implemented as separate dedicated processors or a single or several processors to provide the function of these tools. While executing the computer program code, the processor 630 can read and/or write data to/from memory 640A, storage system 640B, and/or I/O interface 650. The program code executes the processes of the invention. The bus 690 provides a communications link between each of the components in computing device 620.

By way of example, the layout tool 680 may be configured to generate a generic graphical layout of a circuit and text formulas (as shown in FIGS. 1-3). The layout tool 680 may be loaded in an operating system of the computing device 620 or may be developed by a developer so that the generic graphical layout of the circuit and the text formulas can be easily modified and displayed in a graphical browser. Further, activating the text formulas through the layout tool 680 can be accomplished using a software program, such as a compiler, present in the computing device 620. Further, the compiler only needs code which correlates the text formulas in the generic graphical layout to the connections in the netlist hierarchy in order to perform customization of the generic graphical layout Although FIGS. 1-6 show aspects of the present disclosure, these should not be considered limiting features of the present disclosure as other embodiments are contemplated herein. For example, a text formula may be PNT/3=READN, [SXYZ] READN <3>, M3, V3. This text formula may be placed at an intersection point of an M3 metal and an M4 metal. As described before, M3 is a third sequential metal layer and M4 is a fourth sequential metal layer. The "PNT" identifies the formula type, which is an abbreviation for Pin-Net-Transform. Further, the "PNT" also indicates the logical expression of "when this pin is connected to the net, place the desired transform". The "/3" indicates that the text formula should be evaluated three levels above the kernel. Further, any integer number equal to or above 0 can be used to indicate hierarchical levels. The "READN" parameter is a port name of a kernel for the connection. The "[SXYZ]READ<3>" parameter indicates an expression for the name of the net that is connected to the port. In this scenario, although there are four possible prefix characters (i.e., either "S", "X", "Y", or "Z"), strand 3 (i.e., "<3>") was picked out from a bundled net. The "M3" parameter means that the port is present on the M3 layer. Further, "M3" indicates that a hierarchically-transformed label may be placed at this location (e.g., M3_NET or M3_LABEL).

Further, one of ordinary skill in the art would understand that "/0" is not designed into the original layout. In fact, the compiler will ignore this text if evaluation has taken place at the evaluation point. Thus, "PNT/0" simply indicates the evaluation point. Therefore, "/0" indicates that the evaluation of the text formula occurs at the kernel level instead of the compiled level. For example, in the compiler code, evaluation occurs as there is a decrement from "/1" to "/0". Therefore, when the text formula shows "/0", the text formula has been evaluated at the evaluation point and no more processing is required.

The "V3" parameter means that when the text formula is evaluated at three levels of hierarchy above the kernel. Further, if that evaluation is "True", a "V3" cell will be placed. The placement of the "V3" cell will use the hierarchically transformed location and orientation of the original text. In other words, the text formula is placed in the kernel where the connection to the via is down from M4 to M3 (i.e., activated and evaluated as "True"). In contrast, if the text formula is evaluated as "False", no shape is drawn and nothing is instantiated.

In further embodiments of the present disclosure, "PNTI" can be used as a text formula instead of "PNT". For example, "PNTI" is similar to "PNT" except it is invisible. In other words, no net/port labels are placed at intermediate levels of the hierarchy. In another embodiment of the present disclosure, "PIO" bubbles a net/port label up the hierarchy, applying appropriate name transformations. "PIO" guarantees that there will be a label at a prime cell. A variation on this embodiment is "PIOT", which similar to "PNT", places a transform at the prime cell. "PIOT" can be used to place a pin cell.

In further embodiments, "PWR" is similar to "PIO", but bubbles up a power/ground port. In further embodiments, "BUS" is similar to the "PNT" text formulas, but it is used for bused source signals. For example, addressing is done with, e.g., a M3 metal that crosses under many M4 metals. A via will connect the M3 metal to one of those M4 metals. Further, the "BUS" text formula has a text and an associated polyline. The polyline may identify the points associated with each relevant M3/M4 intersection. For a polyline "BUS" text formula, the formula may be BUS/3=READN, [SXYZ]READN<#>,[01324576],M3,V3. In this case, the M3 wire has run under eight relevant M4 wires. The polyline has a relevant vertex under each of those intersection points. The text formula "BUS" is placed under the zero-th intersection for READN<0>. The next intersection is placed at READN<1>, then READN<3>, READ<2>, READ<4>, etc. As stated above, the numbers don't have to be in numerical order, but the numerical order must be identified.

In further embodiments, "ILT" is a text formula which stands for Instance Lookup Table. This text formula can be in the form of "ILT/3=*,*". As the hierarchy is ascended, the formula is examined, and for that examination, the first "*" is replaced with the current cell name and the second "*" is replaced with the hierarchical instance path from the current cell to the kernel containing the text formula. The formula is used in conjunction with a lookup table that has regular expressions for the eventual value of the complete text string to the right of the "=" sign. Further, at an appropriate level of hierarchy, the text formula is checked for a match in the lookup table. If a match is found (i.e., activated and evaluated as "True"), another entry in the table contains the name of the cell to be instantiated at the hierarchically transformed coordinates and orientation of the text. As a variation, additional fields can be added with additional commas to refine searches in the lookup table.

In additional embodiments of the present disclosure, the "/3" as shown above for the hierarchy level can be replaced by another variation on the text formula (i.e., "@ShortName="). In this aspect of the present disclosure, "ShortName" has a value that refers to one or more entries in an expression table. At each level of the hierarchy, table entries associated with "ShortName" are evaluated against the current cell name. If there is a match (i.e., activated), the rest of the text formula is evaluated. If there is no match, the text formula is passed up to the next level of hierarchy. In other words, instead of stating "go up N levels of hierarchy and evaluate", @ShortName is used to evaluate when a match occurs (i.e., activated and evaluated as "True") across the levels of hierarchy.

In the present disclosure, all of the methods above instantiate a cell that inherits the location and orientation of the text. In addition, there is a "user-exit" method to allow more specialized commands. Two examples that have been implemented are "DrawVias" and "DrawRect". The former example draws an array of vias, which can also be an M×N array, or a single via (i.e., 1×1 array). Further, M and N are integer values. The latter example draws a rectangle.

In further embodiments of the present disclosure, "DrawVias" can be used with the text formula "PNT/N=". In an example, a bank address control can be personalized for a refresh operation. In an example, a cell "OZ_AI256X8S" in a kernel contains a text string (in a human-readable form of layout graphical data) ALPHA N GROW_KEY 13039 245 163 200 5400 and "PNT/3=SREFYP,[STWZ]REFYP<0>,M3,DrawVias('V3',[1,2])". In the text string, "ALPHA" indicates that this text string is text, "N" indicates that this is a normal topology, "GROW_KEY" indicates that this is a layer purpose pair, "13039" indicates a X coordinate, "245" indicates a Y coordinate, "163" indicates a X size of a font character, "200" indicates a Y size of a font character, and "5400" indicates a 90 degree rotation in a counter clockwise direction. All of these parameters of the text string ALPHA are recognized by a compiler. "PNT/3" indicates that the text formula should be three levels above the kernel and indicates the logical expression of "when this pin is connected to the net, place the desired transform". "SREFYP" indicates the signal name. [STWZ]REFYP<0> indicates a check to see if there is a match between one of SREFYP<0>, TREFYP<0>, WREFYP<0>, and ZREFYP<0>. "DrawVias('V3',[1,2]") indicates that an array of vias will be drawn between M3 metal and M4 metal such that one via is drawn in the X direction and two vias are drawn in the Y direction.

In an example, the cell "OZ_AI256X8S" in the kernel is instantiated in the cell "O_AI256X280D2" at two levels above the kernel in the hierarchy. In the latter cell, the text is located from the kernel such that any necessary fields in the text are new values based upon the new parent cell. Then, the updated text is placed into the new cell, and the position is translated for the placement of the kernel cell. This particular kernel was used in only one place, and the translated text now looks like ALPHA N GROW_KEY4 625791 245 163 200 5400 "PNT/2=SREFYP,[STWZ]REFYP<0>,M3<DrawVias('V3',[1,2])". Note that this is similar to the original text formula, except for the X coordinate (i.e., "625791"). Also "PNT/3" has become "PNT/2", which means that the text formula is evaluated two hierarchical levels above the kernel. The current net name after the "=" sign remains unchanged because the port was assigned to a same net name.

In an example, the cell "O_AI256X8X280D2" at two levels above the kernel in the hierarchy is placed four times in the cell "O_ZAO8X256X8X280D2" (i.e., at one level above the kernel in the hierarchy), so the new cell will contain four copies of that text. Translation is similar to what has been described herein. In fact, the same code is doing the same job. Thus, the four pieces of text will look like:

ALPHA N GROW_KEY3 625791 138565 163 200 5400;
"PNT/1=REFYP<2>,[STWZ]REFYP<0>,M3,DrawVias('V3',[1,2])";
ALPHA N GROW_KEY3 625791 245 163 200 5400;
"PNT/1=REFYP<0>,[STWZ]REFYP<0>,M3,DrawVias('V3',[1,2])";
ALPHA N GROW_KEY3 625791 207725 163 200 5400;
"PNT/1=REFYP<3>,[STWZ]REFYP<0>,M3,DrawVias('V3',[1,2])";
ALPHA N GROW_KEY3 625791 69405 163 200 5400; and
"PNT/1=REFYP<1>,[STWZ]REFYP<0>,M3,DrawVias('V3',[1,2])".

As before, the number after "PNT/" is decremented by one. In addition, the field after the "=" sign has changed. This reflects the fact that the schematic has connected the SREFYP port to a different net (i.e., "REFYP") for each instance. In this scenario, each instance is a strand of the bundled SREFYP<3:0> net. Also, each piece of text has a unique X,Y coordinate. The instances were all simply stepped in the hierarchy level, so the font and rotation have not changed.

The cell "O_ZAO8X256X8X280D2" is instantiated once in the cell "O_ZA08X256X8X280D2" (i.e., at the kernel level in the hierarchy). The first cell has the letter "O" between "A" and "8" while the second cell has the number "0" in that spot. Again, the text is translated by previous rules and new text is placed in the current cell. Thus, the text can include:

ALPHA N GROW_KEY2 625791 207725 163 200 5400;
"PNT/0=SREFYP<0>,[STWZ]REFYP<0>,M3, DrawVias('V3',[1,2])";
ALPHA N GROW_KEY2 625791 245 163 200 5400;
"PNT/0=SREFYP<0>,[STWZ]REFYP<0>,M3, DrawVias('V3',[1,2])";
ALPHA N GROW_KEY2 625791 138565 163 200 5400;
"PNT/0=SREFYP<0>,[STWZ]REFYP<0>,M3, DrawVias('V3',[1,2])";
ALPHA N GROW_KEY2 625791 69405 163 200 5400; and
"PNT/0=SREFYP<0>,[STWZ]REFYP<0>,M3, DrawVias('V3',[1,2])".

The first model was instantiated at 0, 0 in the second model, so the coordinates have not changed. Of consequence is that the "PNT/n" has now decremented again and become "PNT/0". The "0" in "PNT/0" refers to a hierarchical level where evaluation can take place (i.e., at the kernel level). In this scenario, all four of the previous "REFY<3:0>" ports have been connected to the "SREFYP<0>" net. The evaluation checks to see if "SREFYP<0>" matches the regular expression "[STWZ]REFYP<0>". As the evaluation will return a "True", the text will be used to place something, i.e., execute the "DrawVias('V3',[1,2])" code. Therefore, the code places the "V3" cell in a 1×2 array (i.e., one via in a X direction and two vias in a Y direction). The ground rules for via spacing are "built in" to the DrawVias command (i.e., it is technology dependent). For the technology, the text formulas above are banks 0 through 3 of an 8-bank design. Further, banks 4 through 7 are used at a different kernel. For example, had the value after the "=" sign been, for instance, "SREFYP<1>", it would not have matched the regular expression, and no personalization would have been performed. (i.e., no activation would have taken place and the evaluation for all of the text formulas would have been evaluated as "False").

In another aspect of the present disclosure, the "PNG@shortName" text formula operates similar to the previous example. The cell "OZ_DGOBS" in the kernel contains two pieces of relevant text:

ALPHA N GROW_KEY 28758 13902 166 200 5400;
PNT@AryTop=SDOCLKPI,SDOCLKPDEL,M3, DrawVias('V2',[1,2])";
ALPHA N GROW_KEY 27761 13902 164 200 5400; and
"PNT@AryTop=SDOCLKPI,[STWZ] DOCKLP$,M3, DrawVias('V3',[1,2])".

In the above, text formula "@AryTop" evaluates at a certain named cell by moving down the hierarchical levels until reaching the certain named cell that is designated by a value which corresponds with "AryTop". In the above expression, "SDOCLKPI" is a signal name. The matching phrase can either be "SDOCLKPDEL" or [STWZ] DOCKLP$ for evaluation. The "$" indicates that in "DOCKLP$", P has to be the end of the text string.

The cell "OZ_DGOBS" in the kernel is instantiated in "O_GOB280D2" (i.e., two levels above the kernel in the hierarchy), and using the method above is translated to:

ALPHA N GROW_KEY4 641510 13902 166 200 5400;
"PNT@AryTop=SDOCLKPI,SDOCLKPDEL,M3, DrawVias('V2',[1,2])";
ALPHA N GROW_KEY 641510 13902 164 200 5400; and
"PNT@AryTop=SDOCLKPI,[STWZ] DOCLKP$,M3, DrawVias('V3',[1,2])".

In this scenario, the only change is to the X coordinate. The hierarchical target after the "@" remains unchanged. Also, the port was assigned to a same-name net, so it is unchanged. The cell "O_GOB280D2" is instantiated once in "O_ZAO8X256X8X280D2" (i.e., one level about the kernel in the hierarchy), which yields the text:

ALPHA N GROW_KEY3 641510 290542 166 200 5400;
"PNT@AryTop=SDOCLKPI,SDOCLKDEL,M3, DrawVias('V2',[1,2])";
ALPHA N GROW_KEY3 640513 290542 164 200 5400; and
"PNT @ AryTop=SDOCLKPI,[STWZ] DOCLKP$,M3, DrawVias('V3',[1,2])".

Only the Y coordinate has changed, and again the port is assigned to a same name net. As shown above, the cell "O_ZAO8X256X8X280D2" is instantiated in "O_ZA08X256X8X280D2" (i.e., at the kernel level in the hierarchy). The key difference in the text is:

ALPHA N GROW_KEY2 641510 290542 166 200 5400;
"PNT/0=SDOCLKPDEL,SDOCLKPDEL,M3,DrawVias ('V2',[1,2])";
ALPHA N GROW_KEY2 640513 290542 164 200 5400; and
"PNT/0=SDOCLKPDEL,[STWZ] DOCLKP$,M3, DrawVias('V3',[1,2]".

The text "PNT@AryTop=" has become "PNT/0=". As above, "PNT/0=" is where text formula will be evaluated for personalization (i.e., activated). This condition was met because of the evaluation of "AryTop". The compiler has a "ShortNames" table, and that table has particular entries:

AryTop ^O_[MZ] A [0-9] {2} X256X8X [0-9] {3} D [1-4] $;
AryTop ^[JM]_[MZ] F [0-9] {2} X128X8X [0-9] {3} D [1-4] $; and
AryTop ^Q_ZF [0-9] {2} X128X8X [0-9] {3} D [1-4] $.

The leading "^" indicates the start of a string, where no extra characters should be allowed in front. Similarly, with the "$", this indicates that one of 1, 2, 3, or 4 has to be at the end of the string (i.e., for [1-4]). The "[MZ]" in the first line means that either "M" or "Z" may appear as the third character in the string, and nothing else. Additionally, for the text string, "O_" has to be the first two characters and "A" the fourth. Next, the "[0-9]" means any single-digit number. Further, the {2} after the "[0-9] {2}" means that the combined expression requires any two-digit number (e.g., "33"). Finally, the {3} after the "[0-9] {3}" means that any combined expression requires a three-digit number (e.g., "101"). [1-4] means any number of 1, 2, 3, and 4. This syntax is also used in the lookup table that is used in the "ILT" formula.

The current cell, "O_ZA08X256X8X280D2" is at the kernel level in the hierarchy. Thus, the current cell "O_ZA08X256X8X280D2" matches the first entry in the table, meaning that this is the "evaluation level", such the first part of the string was changed to the triggering "PNT/0=". For these two text strings, the first is matching "SDO-CLKPDEL" against "SDOCKLKPDEL", which matches. Thus, a 1×2 array of "V2" cells are placed at 641510,290542 (X, Y coordinates), rotated 90 degrees counter clockwise. The second string is matching "SDOCLKPDEL" against "[STWZ]DOCLK$". The "S" at the front matches, but at the back the "$" means that it's looking for the string to end in "P", so the match fails (i.e., evaluation is "False", and no activation occurs), and no personalization is performed.

A third example covers the "ILT/n=" method. The cell "OA_256X8CAP" of the kernel contains the text:

ALPHA N GROW_KEY 653 7398 82 100 0 'ILT/3=NB-GAP,*,*'.

The cell "OA_256X8CAP" is instantiated twice in "O_A256X8X148" (i.e., two levels above the kernel in the hierarchy), yielding the text:

ALPHA N GROW_KEY6 321013 7398 82 100 0;
"ILT/2=NBGAP,O_A256X8X148,XCAP1";
ALPHA N GROW_KEY6 339 7398 82-100 10800; and
"ILT/2=NBGAP,O_A256X8X148,XCAP0".

Note that the first "*" has been replaced by the current cell name (e.g., "O_A256X8X148"), and the second "*" has been replaced by the instance path to the kernel, in this case "XCAP1" and "XCAP0". Further, the Y coordinate of "−100" is flipped in comparison to "100". Also, "10800" indicates that the rotation is 180 degrees in a counter clockwise direction.

Each of the above cells is used once in "O_AI256X8Xnnn" and "O_AO256X8Xnnn" (i.e., both cells are at one level above the kernel in the hierarchy), respectively giving:

ALPHA N GROW_KEY5 321013 9218 82 100 0;
"ILT/1=NBGAP,O_AI256X8X148,XCAP1.XA0";
ALPHA N GROW_KEY5 339 9218 82-100 10800;
"ILT/1=NBGAP,O_AI256X8X148,XCAP0.XA0";
ALPHA N GROW_KEY5 321013 9218 82 100 0;
"ILT/1=NBGAP,O_AI256X8X132,XCAP1.XA0";
ALPHA N GROW_KEY5 339 9218 82-100 10800;
"ILT/1=NGGAP,O_AI256X8X132,XCAP0.XA0";
ALPHA N GROW_KEY5 339 9218 82-100 10800;
"ILT/1=NBGAP,O_AO256X8X148,XCAP0.XAO";
ALPA N GROW_KEY5 291061 9218 82 100 0;
"ILT/1=NBGAP,O_AO256X8X148,XCAP1.XAO";
ALPHA N GROW_KEY5 339 9218 82-100 10800;
"ILT/1=NBGAP,O_AO256X8X132,XCAP0.XA0";
ALPHA N GROW_KEY5 291061 9218 82 100 0; and
"ILT/1=NBGAP,O_AO256X8X132,XCAP1.XA0".

As before, the first "*" is simply the current cell. For the second "*" the hierarchical path down to the kernel containing the original text has been extended. The "O_AI . . . " cells are used in "O_AI256X8X280D2" and the "O_AO . . . " cells are used in "O_AO256X8X280D2" (i.e., both cells are at the kernel level in the hierarchy), yielding:

ALPHA N GROW_KEY4 339 9218 82-100 10800;
"ILT/0=NBGAP,O_AI256X8X280D2, XCAP1.XA0.XWORD1";
ALPHA N GROW_KEY4 612413 9218 82 100 0;
"ILT/0=NGBAP,O_AI256X8X280D2, XCAP0.XA0.XWORD0";
ALPHA N GROW_KEY4 291739 9218 82-100 10800;
"ILT/0=NGBAP,O_AI256X8X280D2, XCAP1.XA0.XWORD0";
ALPHA N GROW_KEY4 291061 9218 82 100 0;
"ILT/0=NGBAP,O_AI256X8X280D2, XCAP0.XA0.XWORD1";

ALPHA N GROW_KEY4 291739 9218 82-100 10800;
"ILT/0=NBGAP,O_AO256X8X280D2,
XCAP1.XA0.XWORD0";
ALPHA N GROW_KEY4 291061 9218 82 100 0;
"ILT/0=NBGAP,O_AO256X8X280D2,
XCAP0.XA0.XWORD1";
ALPHA N GROW_KEY4 612413 9218 82 100 0;
"ILT/0=NBGAP,O_AO256X8X280D2,
XCAP0.XA0.XWORD0";
ALPHA N GROW_KEY4 339 9218 82-100 10800; and
"ILT/0=NGBAP,O_AO256X8X280D2,
XCAP1.XAO.XWORD1".

The "ILT/0=" means that this is the point where the text is evaluated for personalization (i.e., evaluation level). In this scenario, a file called "LookupTable" will have many entries. The relevant entries for this example are:

NBGAP OA_NBGAP NBGAP, O_A[IO] 256XBX [0-9] {3} D [234], XCAP1 \.XAO\.XWORD0
NBGAP OA_NBGAP NBGAP,O_A[IO] 256XBX [0-9] {3} D4,XCAP1\.XAO\.XWORD2.

In the present disclosure, the identification for this set of entries is the first field "NBGAP", which also corresponds to the first field after the "=" in the text string. The second field in this entry is "OA_NBGAP", which is the cell which will be instantiated if the evaluation condition is met. [IO] means the character must be either "I" or "O". Further, "[0-9] {3}" means that any combined expression requires a three-digit number (e.g., "101"). The third field is a regular expression which is matched against the entire text string after the "=". As an example, the expression of "NBGAP, O_A[IO] 256XBX [0-9] {3} D [234], XCAP1 \.XAO\.XWORD0" matches "NGBAP,O_AI256X8X280D2, XCAP0.XA0.XWORD0" (shown above in the "ILT/0=" expressions).

For the eight strings above, the third and fifth strings match. The cell "OA_NBGAP" will be placed at 291739, 9218 (X and Y coordinates) rotated 180 degrees, once in the cell O_AI256X8X280D2 and once in the cell O_AO256X8X280D2. For the other six test strings, nothing will be done. Further, the level "GROW_KEY" is used for the text in the kernels as input to the complier. Therefore, when placing intermediate text as going up the hierarchy, a number is appended to "GROW_KEY" to reflect how far below the top-level the current cell was.

As should now be understood by those of skill in the art, embodiments described herein describe placing text in the layout at each level of the hierarchy, and then evaluating and editing at each level of the hierarchy. Further, data structures may be used to write text into each level of the hierarchy and generating the graphical output. However, in another embodiment, text may not be used. Instead, the values may be kept in data structure fields, which eliminate the need for repetitive parsing of text.

In further embodiments of the present disclosure, a "unique handle" can also be placed in the graphical layout instead of text formulas. A unique handle can be defined in a separate configuration file with an associated between the layout cell, the unique handle, and a related formula. In one scenario, a configuration file may be created for each layout cell. In this situation, the unique handle would begin a line in the file, and the formula would follow the unique handle on the line. In an embodiment, the unique handle can be a sequence number. In embodiments, the unique handle can be a recognizable mnemonic.

Although the present disclosure has focused on adding shapes to the design, or adding a cell that just contains shapes, in embodiments, circuits may be added to the design and/or graphical layout. In this scenario, the circuit will be placed on the graphical layout using the text formula. For example, if a kernel is used in multiple locations and there is a "hole" in the kernel, a specific circuit may be placed in the hole of one kernel location and a different circuit may be placed in the hole of another kernel location. In one example, the different circuit may be a decoupling capacitor.

The method as described above for editing and customizing graphical data is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A system comprising:
a CPU, a computer readable memory, and a computer readable storage device;
first program instructions to generate a graphical layout of a circuit;
second program instructions to place a text formula on the graphical layout of the circuit; and
third program instructions to customize the graphical layout of the circuit in response to the text of the formula being evaluated as true,
wherein the first program instructions, the second program instructions, and the third program instructions are stored on the computer readable storage device for execution by the CPU via the computer readable memory, and
the graphical layout of the circuit is customized and utilized for fabrication of an integrated circuit.
2. The system of claim 1, wherein the graphical layout of the circuit is customized by a software program on the computer readable storage device, which is a compiler which customizes the graphical layout using a netlist and the text formula.
3. The system of claim 2, wherein the text formula includes embedded information which is interpreted using information present in a netlist in order to provide instructions for customizing the graphical layout.

4. The system of claim 1, wherein the graphical layout of the circuit is customized by drawing a shape at a specified location of the text formula, in accordance with contents of the text formula.

5. The system of claim 4, wherein the specified location of the text formula is at an origin of the text formula.

6. The system of claim 4, wherein the specified location of the text formula is at an end of the text formula.

7. The system of claim 1, wherein the graphical layout of the circuit is customized by drawing a polyline at a specified location of the text formula.

8. The system of claim 7, wherein the specified location of the text formula is at an origin of the text formula.

9. The system of claim 7, wherein the specified location of the text formula is at an end of the text formula.

10. The system of claim 1, wherein the graphical layout of the circuit includes at least one metal layer and at least one via layer of the circuit.

11. The system of claim 1, wherein the text formula includes a parameter which indicates a hierarchical level above a kernel in which the graphical layout of the circuit is customized.

12. A computer program product comprising a computer readable storage device having program instructions embodied therewith, wherein the computer readable storage device is not a transitory signal, and the program instructions are readable by a computing device to cause the computing device to perform a method comprising:
generating a graphical layout of a circuit;
placing a text formula on the graphical layout of the circuit; and
customizing the graphical layout of the circuit by drawing a polyline at an origin of the text formula in response to the text formula being evaluated as true,
wherein the graphical layout of the circuit is customized and utilized for fabrication of an integrated circuit.

13. The computer program product of claim 12, wherein the graphical layout of the circuit is customized by a software program on the computer readable storage device, and the software program is a compiler which draws the polyline at an origin of the text formula using a netlist and the text formula.

14. The computer program product of claim 13, wherein the text formula includes embedded information which is interpreted using information present in a netlist in order to provide instructions for customizing the graphical layout.

15. The computer program product of claim 12, wherein the graphical layout of the circuit includes at least one metal layer and at least one via layer of the circuit.

16. The computer program product of claim 12, wherein the text formula includes a parameter which indicates a hierarchical level above a kernel in which the graphical layout of the circuit is customized.

17. A method implemented in a computer infrastructure having computer executable code tangibly embodied on a computer readable storage device having programming instructions configured to:
generate a graphical layout of a circuit;
place a text formula on the graphical layout of the circuit; and
customize the graphical layout of the circuit by drawing a shape at an origin of the text formula in response to the text formula being evaluated as true,
wherein the graphical layout of the circuit is customized and utilized for fabrication of an integrated circuit.

18. The method of claim 17, wherein the graphical layout of the circuit is customized by a compiler on the computer readable storage device, and the compiler draws the shape at an origin of the text formula using a netlist and the text formula.

19. The method of claim 17, wherein the graphical layout of the circuit includes at least one metal layer and at least one via layer of the circuit.

20. The method of claim 17, wherein the text formula includes a parameter which indicates a hierarchical level above a kernel in which the graphical layout of the circuit is customized.

* * * * *